United States Patent [19]
Okayama et al.

[11] Patent Number: 6,103,669
[45] Date of Patent: Aug. 15, 2000

[54] SUPERCONDUCTING WIRE AND METHOD OF PRODUCING THE SAME

[75] Inventors: Akira Okayama, Hitachi; Michiya Okada, Mito; Tadaoki Morimoto, Ibaraki-ken; Toshimi Matsumoto, Katsuta; Yoshimi Yanai, Hitachi; Hiroshi Satoh, Hitachi; Toshiya Doi, Hitachi; Kazuhide Tanaka, Hitachi; Takahiko Kato, Hitachi, all of Japan

[73] Assignee: Hitachi, Ltd., Tokyo, Japan

[21] Appl. No.: 08/448,137

[22] Filed: May 23, 1995

Related U.S. Application Data

[62] Division of application No. 08/267,298, Jun. 29, 1994, abandoned, which is a continuation of application No. 07/250,110, Sep. 28, 1988, abandoned.

[30] Foreign Application Priority Data

| Sep. 28, 1987 | [JP] | Japan | 62-240773 |
| Nov. 18, 1987 | [JP] | Japan | 62-289353 |
| Dec. 2, 1987 | [JP] | Japan | 62-303168 |

[51] Int. Cl.[7] .................................................. H01L 39/24
[52] U.S. Cl. ............................ 505/430; 29/599; 505/433
[58] Field of Search ............................. 29/599; 505/430, 505/433

[56] References Cited

U.S. PATENT DOCUMENTS

3,243,871  4/1966  Saur ........................................ 29/599

OTHER PUBLICATIONS

"High Tc Superconductors—Composite Wire Fabrication", Jin et al., Appl. Phys. Lett. 51(3), Jul. 20, 1987.

*Primary Examiner*—Joseph M. Gorski
*Attorney, Agent, or Firm*—Antonelli, Terry, Stout & Kraus, LLP

[57] ABSTRACT

This invention provides an oxide-type superconducting flat wire having a critical current density of at least 1,000 A/cm$^2$, which comprises a Y—Ba—Cu oxide layer having a superconducting property and a silver layer surrounding the oxide layer and has so flat a cross section vertical to the longitudinal direction of the wire that the upper and lower lines between the oxide layer and the silver layers appearing on the cross section having a zone over they are parallel to each other, the thickness of the oxide layer being cold rolled in the range of 0.35 to 0.75 based on the whole thickness of the wire, the whole thickness being 0.2 mm or less, and the metal layer being deformable to follow the shrink deformation of the oxide layer when heat treated to be sintered, but rigid when used. This flat wire is produced by filling a silver-made tube with a Y—Ba—Cu oxide powder having a superconducting property, drawing the tube into a rod wire having a round cross section, then cold rolling the rod wire in the flat wire so that $(t_i-t)/t_i \times 100$ is equal to or greater than 90%, wherein $t_i$ is the whole thickness of the cross section of the rod wire before the cold rolling and t is the whole thickness of the cold-rolled flat wire, and then heat treating the flat wire to sinter the superconducting oxide.

6 Claims, 4 Drawing Sheets

FIG. I (A)
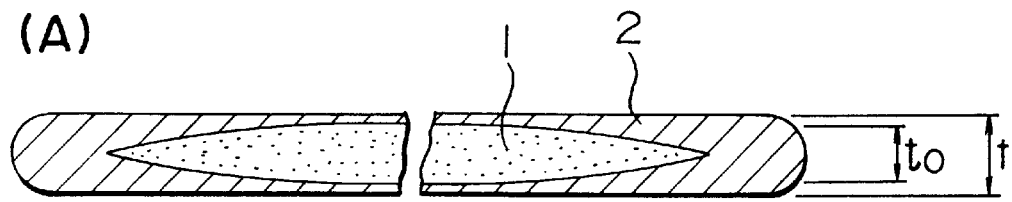
FIG. I (B)
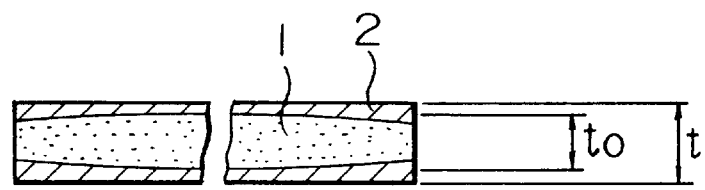
FIG. I (C)
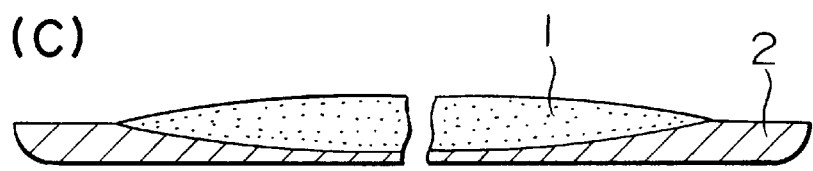
FIG. I (D)
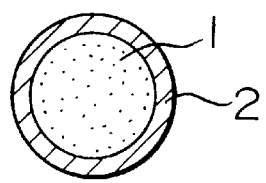

SUPERCONDUCTING WIRE AND METHOD OF PRODUCING THE SAME

This is a division of application Ser. No. 08/267,298, filed Jun. 29, 1994, now abandoned which is a continuation of application Ser. No. 07/250,110, filed Sep. 28, 1988, now abandoned.

BACKGROUND OF THE INVENTION

1. Field of the Invention

This invention relates to a novel oxide-type superconducting flat-shaped wire and a method of producing the flat-shaped wire, more particularly to an oxide-type superconducting flat wire having a composite cross-sectional structure composed of an oxide phase exhibiting a superconducting property and a metal phase, particularly having a very high critical current density.

The superconducting flat wire of this invention can be used as a coil for a rotor and stator of rotator, a coil for energy storage, a coil for a plasma vessel of nuclear fusion, a cable for power transmission and distribution, a coil for a transformer, a coil for a particle accelerator, a magnetic coil for MRI and NMR, a coil for an electron microscope, a magnetic coil for an atomic-absorption spectrometer, a coil for an rotor and stator of a motor for an electric car, automobile, elevator and escalator, and a magnetic coil for a linear motor car.

2. Description of Related Art

As a high-temperature superconducting material having a much higher superconducting transition temperature than that of prior art superconducting materials, a lanthanum-barium-copper oxide was discovered by Dr. J. G. Bednorz and Dr. K. A. Müller at the beginning of 1986, and then an yttrium—barium—copper oxide (hereinafter referred to as Y—Ba—C—O or YBaCuO), which has a transition temperature of about 90 K, was discovered by Dr. Chu of Houston University in U.S.A in the spring of 1987. Such discovery was made also in China and Japan at that time. These discoveries in succession are called the "revolution of superconductors". Nowadays, there are intensively made fundamental studies on the composition, crystal structure, properties and theory of superconducting materials, practical studies on methods of synthesizing the materials, on electronic or power electrical applications of the materials and further on research or development of new materials exhibiting superconducting transition at room temperature or at a higher temperature.

In these studies, research and development, a technique of shaping the high-temperature superconducting materials occupies a position as an elementary technique in power electrical applications such as a superconducting magnet. In prior art superconducting alloys or chemical compounds, it is known that the cross section of the shaped article is constituted by a composite phase of a superconducting phase and a metal phase. The metal phase functions as a supporter for a superconducting material while the material is being plastically worked in a long article and heat treated, as a strength-holding means during or after coiling of a superconducting wire, or as a stabilizer against the superconducting-to-normal transition in applying electric current to the article.

As regards the production of oxide-type superconducting wires, possibilities of materials as a wire-constituting metal phase (hereinafter referred to as a metal sheath), methods of plastically working to realize wire-shaped articles and tried methods of heat treating the wire-shaped articles have been reported by, for example, newspapers, *Nihon-Keizai Shimbun* dated Mar. 4, 1987 and Apr. 3, 1987 and *"New Superconductors—State of Development and Applications Thereof"*, published Nikkei-McGraw-Hill on Jun. 15, 1987. These wire-shaped articles have a critical current density of only at most several hundred amperes per square centimenter.

As mentioned above, the oxide-type superconducting wires already developed have a critical current density of at least two figures lower than the current density industrially required. Furthermore, no structure of wires to raise the critical current density of the wires has yet been sufficiently known.

SUMMARY OF THE INVENTION

One object of this invention is to provide an oxide-type superconducting wire having a critical current density of at least 1,000 A/cm$^2$.

Another object of this invention is to provide a method of producing an oxide-type superconducting wire having a critical current density of at least 1000 A/cm$^2$.

In accordance with this invention, there is provided an oxide-type superconducting flat wire having a critical current density of at least 1,000 A/cm$^2$, which comprises an oxide layer having a superconducting property and a metal layer surrounding the oxide layer and has so flat a cross-section vertical to the longitudinal direction of the wire that the upper and lower lines between the oxide layer and the metal layers appearing on the cross section having a zone over which they are parallel to each other, the thickness of the oxide layer being cold rolled in the range of 0.35 to 0.75 of the whole thickness of the wire, the whole thickness being 0.2 mm or less, and the metal layer being deformable to follow the shrink deformation of the oxide layer when heat treated to be sintered, but rigid when used.

Furthermore, in accordance with this invention, there is provided a method of producing an oxide-type superconducting flat wire having a critical current density of at least 1,000 A/cm$^2$, which comprises filling a metal tube with an oxide powder having a superconducting property, drawing the tube into a rod wire having a round cross section, then cold rolling the rod wire into the flat wire so that $(t_i-t)/t_i \times 100$ is equal to or greater than 90, wherein $t_i$ is the whole thickness of the cross section of the rod wire before the cold rolling and t is the whole thickness of the cold-rolled flat wire, and then heat treating the flat wire to sinter the superconducting oxide.

BRIEF DESCRIPTION OF THE DRAWINGS

FIGS. 1(A) to 1(C) are cross-sectional views of the oxide-type superconducting flat wires in accordance with one embodiment of this invention and FIG. 1(D) is a cross-sectional view of a comparative example of the oxide-type superconducting wire.

DETAILED DESCRIPTION OF THE PREFERRED EMBODIMENTS

Figure 2:
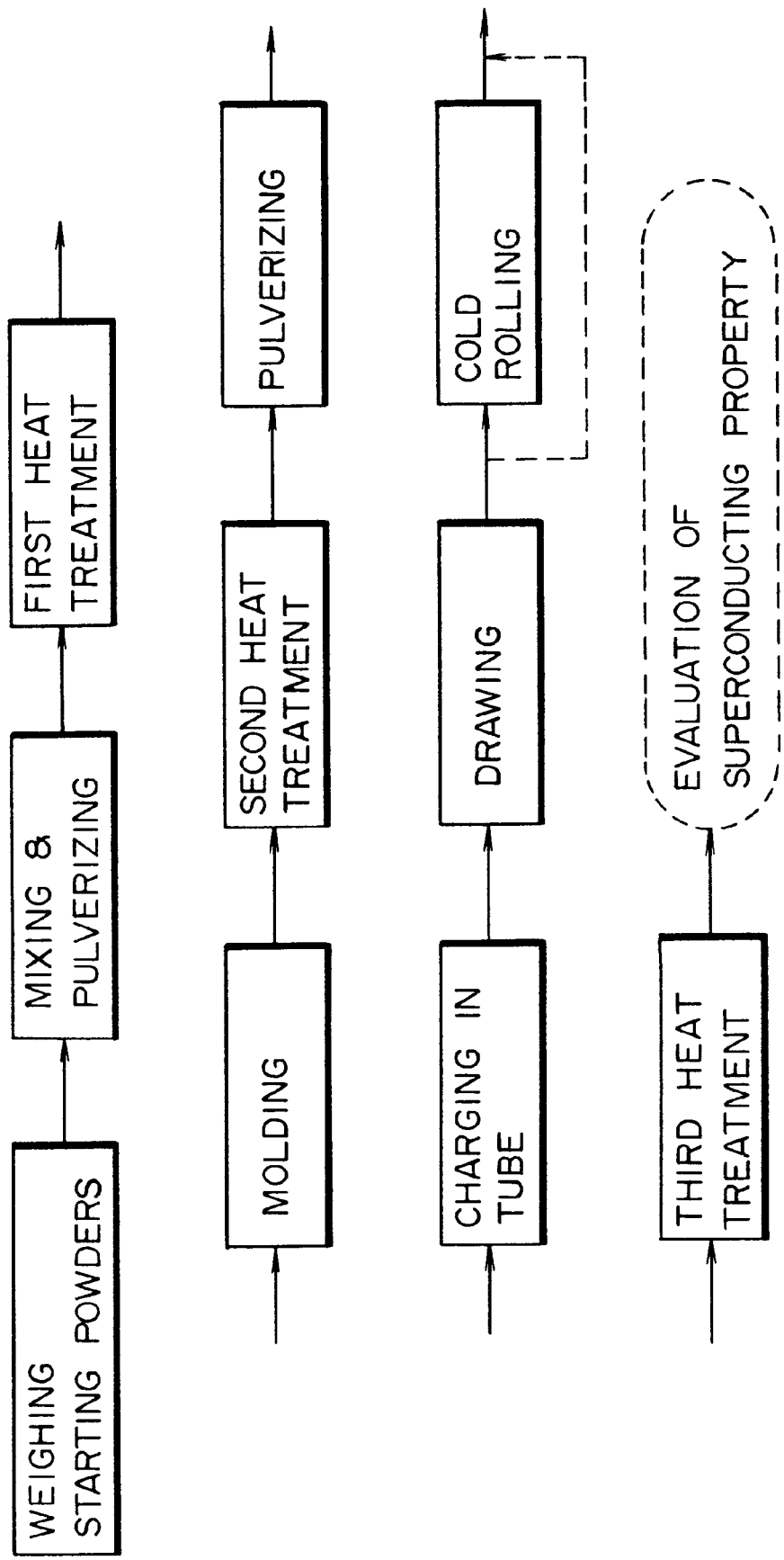
FIG. 2 is a flow chart of the process practiced in accordance with this invention.

In accordance with this invention, the oxide-type superconducting wire is in a flat shape and comprises an oxide layer having a superconducting property and a metal layer surrounding the oxide layer. In the cross section of the flat wire, the upper and lower lines between the oxide layer and metal layers have a zone over which they are parallel to each other. The metal layers both have a thickness smaller than that of the oxide layer over the parallel zone. That is, the whole thickness of the metal layers at the parallel zone is in the range of 25 to 65%, preferably 35 to 60% based on the whole thickness of the flat wire including the oxide layer. The metal layers are deformable to follow the shrink deformation of the oxide layer when heat treated to be sintered, but they are rigid when used. The flat wire is flexible in a longitudinal direction.

The oxide-type superconducting wire of this invention has a flat-shaped cross section, in other words, it is a plate wire or ribbon wire. The greater a ratio of the circumferential length to the surface area of the cross section of the wire, the easier the absorption of oxygen from ambient atmosphere into the oxide layer is when heat treated for affording the superconducting property to the wire.

In the heat treatment for affording the superconducting property to the wire, the volume shrinking of the oxide layer as the oxide particles are sintered cannot be avoided. However, the metal layer of the wire having a flat cross section is conspicuously easier to be deformed by shrinking than that of the wire having a round cross section, by converting the directions of the shrink deformation of the oxide layer and the deformation of the metal layers following said shrink deformation from a radially inward direction to thickness and width directions in the cross section. Since the metal layer used in this invention is easily deformable, good adhesion at the interface between the oxide layer and the metal layer is secured.

It is one of the requirements of this invention that the cross section of the superconducting wire is in a flat form, which itself gives such effect and advantages as mentioned above.

The object of this invention can be achieved when the superconducting wire is in a flat form, which comprises a superconducting oxide layer positioned at the center in the cross section of the wire and metal layers surrounding the oxide layer and has a whole thickness of 0.2 mm or less including the thickness of the oxide layer plus the total thickness of the metal layers, the total thickness of metal layers being within the range of 25 to 65% based on said whole thickness.

However, these requirements alone give a wire not having a high current density, because other methods, for example, a doctor blade method or screen printing method, produce similar flat wires under these requirements. Wires produced by these methods have as low a critical current density as about 100 A/cm$^2$ (see *Journal of the Japan Institute of Metals,* Vol. 26, No. 10, 1987, p.981). One of the causes for the critical current density being low is considered that the density of the oxide layer is low. The function of superconductor is nothing but to admit an electric current flow and hence if there are present vacancies in the superconductor, then an electric current is reduced.

Thus, it is firstly considered important and necessary to give a sufficiently raised density to the oxide layer in producing superconducting wires. Through various experiments the present inventors have found that the density of the oxide layer can be sufficiently raised up by cold rolling a metal tube constituting the metal layer (hereinafter referred to as a metal sheath) filled with a superconducting oxide powder.

Each of the technical means constituting the method of the present invention will be explained below.

According to some experiments of the present invention, a relationship between the reduction in cross-sectional surface area and density of a wire produced only by drawing is such that the reduction of cross-sectional surface area is being increased, the density is also increased until the reduction reaches about 60%. When the reduction exceeds about 60%, the raising-up of the density is stopped. This density is 4.4 g/cm$^3$. Even if a wire drawn to a reduction of 98% is heat treated at 950° C. for 24 hours after removing a silver sheath on the wire, the resultant density of the wire is only 5.4 g/cm$^3$ which corresponds to a theoretical density ratio of 0.86.

This means that use of only the wire-drawing step has a limitation in raising the density of the superconducting wire.

Now the present inventors have found that the density of a superconducting wire can be raised by cold rolling the wire so that it is flat, i.e., in a plate or ribbon shape, to reach a critical current density of the wire of at least 1,000 A/cm$^2$.

The reason why the density obtained when cold rolled is higher than that when drawn is considered that the stress is mainly tensile one in drawing, whereas compressing stress is predominant in cold rolling.

The wire according to this invention is preferably in a form of thin sheet and has a whole thickness of preferably 0.2 mm or less. If the rolled whole thickness is more than 0.2 mm, the desired critical current density may be reached. Preferably it is 0.1 mm, more preferably 0.07 mm.

The width/thickness ratio of the flat wire according to this invention is preferably 20 to 400, more preferably 40 to 100 to obtain wires having no defects.

One of materials exhibiting superconducting property used in this invention is a well-known oxygen-deficient trilayered perovskite-type crystal of yttrium-barium-copper oxide (hereinafter referred to as YBaCuO). This material is in a tetragonal form at high temperatures and in a rhombic form at low temperatures. This material exhibits superconducting property in the rhombic form. When this material is transformed from the tetragonal form to the rhombic form, it is required to take in oxygen. Furthermore, the superconducting property of this material is conspicuously deteriorated due to the crystal anisotropy when pulverized after the superconducting property is given to this material.

The YBaCuO raw material for making a superconducting wire is now prepared by a solid phase reaction method or coprecipitation method. The solid phase reaction method is one wherein powders of $Y_2O_3$, $BaCO_3$ and CuO as starting raw materials are mixed and pulverized and then heat treated to be reacted with each other in solid phase. The coprecipitation method is one wherein Y, Ba and Cu are allowed to coprecipitate together from a solution of Y, Ba and Cu oxalates and the resultant coprecipitate is filtered, dried and heat treated. In both the methods, the heat treatment causes sintering to proceed so that the powders are agglomerated. The thus obtained raw material is pulverized for use in making the wire.

For giving an excellent superconducting property to the YBaCuO, the starting raw materials are required to be of high grade and steadily supplied. In the preparation of the raw material mentioned above, the contamination of the YBaCuO is a problem particularly when the agglomerate obtained by the heat treatment is pulverized. The reason therefor may be explained as follows.

Normally, a ball mill or grinder is used for the pulverization of YBaCuO. However, since the YBaCuO is a very hard oxide, the pot and balls of the ball mill or pestle and vessel of the grinder are consumed during pulverizing to enter the YBaCuO. The pulverization of the YBaCuO is generally carried out for a long period of time to obtain a finer powder having a good sinterability in the heat treatment (which will be in detail explained below) and a good uniformity in composition. This is a cause for raising the contamination of the YBaCuO and hence the effect of making the powder finer is eliminated to induce the reduction of the superconducting property.

The oxide layer in the sheath metal is pulverized when drawn and rolled in a wire, so that the superconducting property is conspicuously reduced, and at the same time a particle-to-particle bond is so mechanical that a sufficient current pass may not be given. Therefore, the drawn and rolled wire is required to be heat treated so that particles may be sintered together. This heat treatment is carried out at a temperature range in which the YBaCuO is in the tetragonal form, and thereafter it is transformed to the rhombic form. The transformation of the tetragonal form to the rhombic form can be attained by annealing after the heat treatment. Oxygen supply in the heat treatment is effected through the metal sheath. If the metal sheath is thick, the oxygen supply is not sufficiently effected and the YBaCuO in the metal sheath is hardly converted to a superconductor. Therefore, it is preferred that the metal sheath or metal layer has a thickness of 0.1 mm or less which is in the range of 25 to 65% of the whole thickness of the wire. The "thickness" of the metal layer used herein means a total thickness of metal layers both on the sides of the oxide layer. The thickness of one side metal layer is a half of the total thickness, which is 0.05 mm or less, i.e., 32.5% or less of the whole thickness of the wire or less. If the thickness of metal layer is 25% or less, the metal layer is broken during rolling, so that the fabrication of long wires is hard.

It is preferred for easily supplying oxygen through the metal layers into the inside oxide layer that the whole thickness is 0.2 mm or less in flat cross section.

The heat treatment of wires at a temperature of 870° C. or lower is not sufficient for sintering to proceed. Thus, the particles are insufficiently bonded together, so that no sufficient current pass is effected. The heat treatment at a temperature of 950° C. or higher causes another crystal phase to form, which phase deteriorates the superconducting property.

The density of the heat treated oxide layer in wires is preferably not less than 0.87, more preferably not less than 0.90, most preferably not less than 0.95 of the theoretical density, because the oxide layer contains many vacancies at the theoretical density ratio of 0.87 or less, which cannot give any high critical current density.

In this invention, the drawing step may be employed, if necessary, prior to the cold rolling step. This drawing step contributes to improvement in the density of oxide layer of a final product wire. The reduction in cross-sectional surface area of wire when drawn is preferably 60% or more. If the drawing step is carried out at a reduction of more than 60%, then the resultant density is not raised up to a higher level. Therefore, the reduction in cross-sectional surface area of at least 60% is necessary to the drawing step. The density of the oxide layer obtained at this reduction in cross-sectional surface area is about 63% or more of the theoretical density.

The cold rolling step according to this invention is in detail explained below.

In the cold rolling step of this invention, it is preferred that the following two equations (1) and (2) should be simultaneously satisfied:

$$0.35 \leq t_o/t \leq 0.75, \text{ preferably } 0.4 \leq t_o/t \leq 0.65 \quad (1)$$

$$(t_i-t)/t_i \times 100 \geq 90 \quad (2)$$

wherein $t_i$ and $t$ are whole thicknesses of wire in cross section before and after the cold rolling step, respectively, and $t_o$ is a thickness of oxide layer in cross section after the cold rolling step.

The density of the oxide layer obtained by this cold rolling is about 90% or more of the theoretical density.

Metal layers, both on the sides of an oxide layer suffer the same amounts of shrinkage in compliance with the shrinkage of the oxide layer, when sintered in the heat treatment by positioning the oxide layer at the center of the thickness of wire, so that the macroscopic curve deformation can be prevented. As a result, it is possible that the thermal strain of the rolled oxide layer is diminished and the critical current density is raised.

As mentioned above, according to the intensive studies by the present inventors, it has been found that the ratio of $t_o/t$ is preferably in the range of 0.35 to 0.75, wherein $t_o$ and $t$ are the thicknesses of the oxide layer and the whole thickness of the rolled wire, respectively, in cross section. If the $t_o/t$ ratio is lower than 0.35, i.e., the thickness of the oxide layer is smaller than 35% of the whole thickness, then the oxide layer is prevented by the restrain of the metal layers from shrinking when heat treated, so that the sintered oxide layer has some strain or cracks generated in a longitudinal direction thereof and furthermore the metal layers and the oxide layer are peeled off from each other, so that the wire may not have high critical current density.

If the wire has a $t_o/t$ ratio of 0.75 or higher, then the shrinking of the oxide layer is not restrained by the metal layers at incipient time of the heat treatment because of the metal layers being thin, but the metal layers suffer fold deformation as the sintering proceeds, so that the folded parts of the metal layers are put on one another. As a result, uniform and free shrinking of the oxide layer in the longitudinal direction thereof is prevented. It follows that this induces the same problems of strain within the oxide layer, peeling-off of the oxide layer from the metal layers or production of cracks in the oxide layer as those of the wire having a $t_o/t$ ratio of less than 0.35. Thus, no high critical current density can be obtained.

The wire according to this invention has a $t_o/t$ ratio of not less than 0.35 but not more than 0.75 has no such problems as mentioned above. That is, when the plastically worked wire is heat treated, the metal sheath is deformed in compliance with the deformation of the oxide layer, whereby no strain, peeling-off or cracks are formed and a very high critical current density can be reached.

The reduction in whole thickness of wire in cold rolling is preferably 90% or more. If it is less than 90%, then the adhesion between the metal layer and the oxide layer is unfavorably poor and allows the interfacial electric resistance to be raised.

As mentioned above, this invention employs a cold rolling technique to produce a superconducing wire having a high critical current density. In this invention, raw materials for YBaCuO are pulverized for a very short period of time to diminish contamination of the YBaCuO. As a result, however, a large amount of a coarse fraction of about 100

μm in size is retained in the pulverized powder. This coarse fraction is again pulverized by the cold rolling technique in the course of producing a flat-shaped wire. The effect of pulverization by cold rolling varies depending upon the reduction in thickness in cross section: $(t_i-t)/t_i \times 100$. As this reduction is increased, the effect of pulverization is increased but is so insufficient at a reduction of less than 90% that particles of 10 μm or more in size still remain in the powder. At a reduction in thickness of 90% or more the pulverization is much promoted so that the particles are of less than 10 μm in size. Thus, the critical current density is much improved.

The packing density of a YBaCuO powder in a metal sheath vessel such as a tube before cold rolling has an effect on the cold rolled wire. If the YBaCuO is charged into the vessel in a low packing density, (1) the effect of the pulverization is conspicuously reduced and (2) the thickness of the resultant wire varies. The reason for (1) above is that the stress by cold rolling is ineffectively applied to the YBaCuO powder and the reason for (2) above is that the stress by cold rolling is concentrated on the very small surface area of the vessel in contact with rollers at the initial time of rolling, so that this contact surface part is thinner than the other parts of the vessel. This causes a crimp to form as the rolling proceeds. The problem of (2) above can be overcome to an extent by making the cross section of the metal vessel rectangular. In order to provide a wire having an unvaried or uniform thickness without occurrence of the problems (1) and (2) above and with increased effect of pulverization, the packing density of YBaCuO charged in a metal vessel before cold rolling should preferably be at least 4.0 g/cm$^3$. Furthermore, according to this invention, this density may be secured by various methods: drawing by, for example, a drawbench, cold isostatic press or insertion of molded highly dense pellets in the metal vessel.

The superconducting property of YBaCuO is deteriorated when pulverized. The YBaCuO in the metal vessel is pulverized and hence deteriorated in superconducting property during cold rolling. Furthermore, the pulverization by the cold rolling causes the particle-to-particle bond to be in a mechanical fashion, which does not permit an electric current to pass through the YBaCuO. Thus, the YBaCuO as cold rolled does not exhibit any superconducting property. Therefore, the cold rolled wire is heat treated. The heat treatment is carried out at a temperature of 870 to 950° C. Sintering of the YBaCuO does not sufficiently proceed at a temperature of lower than 870° C. to secure the electric current path in the YBaCuO. At a temperature exceeding 950° C., another crystal phase is produced to reduce the superconducting property.

The heat treatment is preferably carried out in an oxygen-containing atmosphere, because the YBaCuO is in a tetragonal form at a high temperature and in a rhombic form at a low temperature, the YBaCuO in a rhombic form exhibits a superconducting property and, when the YBaCuO is transformed from the tetragonal form to the rhombic form, it is required to take an amount of oxygen therein. The conversion from the tetragonal form to the rhombic form is attained during annealing after the heat treatment.

The density of the YBaCuO in heat treated wires has an influence on the passing-through of electric current. If the density is too low, no high critical current density can be obtained and, therefore, the density should preferably be higher than 5.7 g/cm$^3$ which corresponds to a ratio to theoretical density of 0.9.

The metal sheath used herein is preferably made of silver or silver base alloys, in view of the permeability of oxygen required. Alloying elements for the silver base alloys are one or more of palladium, platinum, ruthenium and gold. The content of these alloying elements is preferably 10% by weight or less, because if it is above 10% by weight, the permeation of oxygen becomes poor.

This invention will be illustrated below with reference to the following examples.

EXAMPLE 1

This example is explained using FIGS. 1(A) to 1(D) and FIG. 2.

FIGS. 1(A) and 1(B) are partial crosssectional views of an embodiment of the superconducting wires according to this invention, of which the central portion is omitted. In these figures, reference number 1 is a YBaCUO type material exhibiting a superconducting property at a high temperature. Reference number 2 is a silver sheath (t whole thickness of wire; $t_o$: thickness of oxide layer). This flat wire was prepared in accordance with the process shown in the chart of FIG. 2.

In FIG. 2, powders of $Y_2O_3$, $BaCO_3$ and CuO as starting materials for synthesizing the superconducting material were weighed so that the atomic molar ratio of Y:Ba:Cu was 1:2:3, respectively. Then, to these three powders was added water, and mixing and pulverizing of these powders was effected in a centrifugal ball mill for 1 hour. The resultant mixed powder was dehydrated at 150° C. and thereafter subjected to the first heat treatment under the conditions as shown in Table 1. This heat treated mixed powder was molded by metal mold pressing to form pellets of 30 mm in diameter and 3 mm in thickness. These pellets were subjected to the second heat treatment under the conditions as shown in Table 1. The thus obtained pellets were confirmed to be levitated due to the diamagnetism of a superconducting substance when cooled in liquid nitrogen. These pellets were pulverized in a grinder for 10 minutes to obtain a powder, with which were then filled pure silver-made tubes of 6 mm in outer diameter, 4 mm, 5 mm and 5.5 mm in inner diameter, respectively, and 400 mm in length at a theoretical density ratio of 0.5. These tubes were drawn by a drawbench to reduce the outer diameter from 6 mm to 2.8 mm.

TABLE 1

|  | Heating rate (° C./hr) | Heat holding (° C./hr) | Cooling rate (° C./hr) | Atmosphere |
| --- | --- | --- | --- | --- |
| 1st heat treat. | 200 | 950 × 5 | 200 | O$_2$ str. |
| 2nd heat treat. | 200 | 950 × 5 | 200 | O$_2$ str. |
| 3rd heat treat. | 200 | 910 × 5 | 200 | O$_2$ str. |

The drawn wires were cold rolled to have a flat cross section. A cold rolled reduction was about 10% per pass, and when the wires had thicknesses of about 0.5 mm and 0.2 mm, the wires were subjected to a mediate annealing step at 300° C. for 30 minutes. Immediately after the wires were thinner than 0.5 mm a sample of 100 mm in length was taken from the wires and then some samples of the same length were taken at a proper interval as the wires were getting thinner. Some of the samples were cut both at the ends thereof as shown in FIG. 1(B). These samples were subjected to the third heat treatment under the conditions as shown in Table 1.

The thus obtained wires having a flat cross section were further cut in a length of about 30 mm which were used for measurement of the critical current density: Jc. The measurement of Jc was conducted in liquid nitrogen with a usual four-terminal method, wherein the critical current density Jc was calculated by dividing a current determined when a terminal voltage reached 1 μV at a distance between terminals of 10 mm by the cross-sectional surface area of the oxide layer of each sample. The cross-sectional surface area was determined by microscopic observation for each of the samples. The width of each sample was about 5 mm for one of about 0.5 mm in thickness. The thinnest sample was of about 6 mm in width.

TABLE 2

| (a) | | | | | | | | | $t_o/t = 0.42$ |
|---|---|---|---|---|---|---|---|---|---|
| t(mm) | 0.52 | 0.45 | 0.32 | 0.24 | 0.18 | 0.14 | 0.10 | 0.06 | 0.04 |
| Jc | x | Δ | Δ | Δ | o | o | o | o | o |
| (b) | | | | | | | | | $t_o/t = 0.62$ |
| t(mm) | 0.55 | 0.48 | 0.32 | 0.25 | 0.16 | 0.14 | 0.10 | 0.06 | |
| Jc | x | Δ | Δ | Δ | o | o | o | o | |
| (c) | | | | | | | | | $t_o/t = 0.74$ |
| t(mm) | 0.42 | 0.32 | 0.28 | 0.22 | 0.15 | 0.11 | 0.08 | 0.06 | |
| Jc | x | Δ | Δ | Δ | o | o | o | o | | o: Jc > 1,000 A/cm$^2$
Δ: Jc = 300–550 A/cm$^2$
x: Jc < 250 A/cm$^2$

In Table 2, (a), (b) and (c) show relationships between the thickness t and the critical current density Jc of wires drawn and cold rolled from tubes having thicknesses of 1 mm (outer diameter: 6 mm; inner diameter: 4 mm), 0.5 mm (outer diameter: 6 mm; inner diameter: 5 mm) and 0.3 mm (outer diameter: 6 mm; inner diameter: 5.4 mm), respectively. The ratio of the thickness ($t_o$) of the oxide layer to the whole thickness (t) of a wire, $t_o/t$ varies depending upon the thickness of a metal tube which has not been drawn. Wires drawn and cold rolled from tubes having thicknesses of 1 mm, 0.5 mm and 0.3 mm, respectively, had ratios $t_o/t$ of 0.42, 0.62 and 0.74, respectively. The ratio $t_o/t$ was unchanged within a range of error in measurement for each lot of samples made from tubes having the same thickness, even if the resultant thickness was changed. The measurement of Jc was effected for two to four samples made under the same conditions. There was observed a considerable scatter in values of Jc for these samples. Therefore, Table 2 shows the level of Jc values classified with symbols (o, Δ and x). As is seen from Table 2, there was a remarkable increase in Jc values at the specific thicknesses for each of the $t_o/t$ ratios. Furthermore, a sample cut both at the ends thereof as shown in FIG. 1(B) had in general a higher critical current density Jc than that of a non-cut sample.

In addition to the embodiment of this invention as illustrated above, other samples for comparison were experimentally made as shown in FIG. 1(C), which were flat-shaped wires; one having a metal sheath removed at one side thereof and another (not shown) having upper and lower metal layers different in thickness from each other. One of these comparative samples was remarkably curved toward the side of the metal sheath-removed face and the other curved toward the side of the thinner metal layer. The Jc values of these comparative samples were below 250 A/cm$^2$. A still further sample for comparison was made as shown in FIG. 1(D). This sample had a round-shaped cross section and was made in accordance with the process as shown in the chart of FIG. 2, except for the cold rolling step (as shown in the dotted line). The outer diameter and thickness of a tube before drawing were 6 mm and 0.5 mm, respectively. The drawn tube had a diameter of 1.7 to 0.8 mm. This drawn tube was subjected to the third heat treatment under the same conditions as those under which the flat wire was heat treated. The thus obtained wire having around cross section had a Jc of at most 350 A/cm$^2$.

The microstructures in cross section of the samples mentioned above were observed after the third heat treatment. This observation revealed that the drawn and cold rolled flat wires had an oxide layer containing a much smaller amount of vacancies than the drawn but non-rolled round wire, that is, the former was much denser than the latter, and further that the crystal grains of the sintered oxide layer of the flat wires were conspicuously refined.

The critical current density Jc of the drawn and cold rolled flat wire exceeded 1,000 A/cm$^2$.

In this example, pure silver was effectively used as sheath metal, but the same effect can be expected with a silver alloy containing a noble metal such as palladium.

As is seen from the example, in this invention, the oxide layer of the superconducting wire can satisfactorily be sintered, the thermal shrinking of the oxide layer is not prevented by the metal sheath, and the resultant wire has a critical current density above 1,000 A/cm$^2$.

EXAMPLE 2

This example will be explained using FIGS. 3 and 4.

Figure 3:
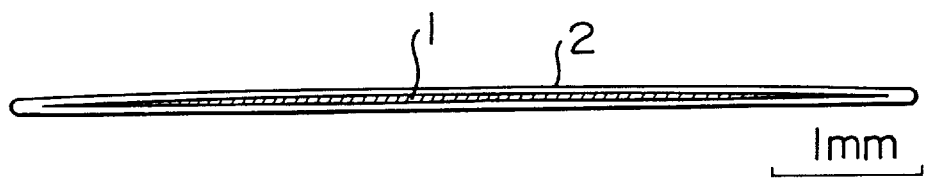
FIG. 3 is a cross-sectional view of the oxide-type superconducting flat wire in accordance with another embodiment of this invention.

FIG. 3 is a cross-sectional view of a superconducting wire according to this invention. A superconducting YBaCuo layer 1 is present at the center in the cross section of the wire. A silver sheath 2 surrounds the YBaCuO layer 1. This wire was prepared in accordance with a series of process steps as mentioned below.

Firstly, powders of $Y_2O_3$, $BaCO_3$ and CuO as starting materials for synthesizing the superconducting material were weighed so that the atomic molar ratio of Y:Ba:Cu was 1:2:3, respectively. Then, to these three powders was added water, and mixing and pulverizing of these powders was effected in a centrifugal ball mill for 1 hour. The resultant mixed powder was dehydrated at 150° C., calcined at 950° C. for 5 hours in an oxygen atmosphere and thereafter this calcined mixed powder was molded by metal mold pressing to form pellets of 30 mm in diameter and 3 mm in thickness. These pellets were sintered at 950° C. for 5 hours. These pellets were confirmed to be levitated due to the diamagnetism of superconducting substance when cooled in liquid nitrogen. These pellets were pulverized by a grinder for 30 minutes. With the resultant powder was filled and sealed a pure silver-made tube having an outer diameter of 6 mm and an inner diameter of 5 mm at a density of 2.7 g/cm$^3$.

The wires were prepared from the tubes above by the following two methods; method [I] comprising reducing the diameter of wire with a drawbench to obtain the round wires having different diameters; and method [II] comprising firstly drawing the tubes to a diameter of 2.8 mm with a drawbench (a whole reduction in cross-sectional surface area of 78.2%) and secondly cold rolling the drawn tubes to obtain the flat wires having different thicknesses.

These wires were cut in a length of about 30 cm, subjected to the heat treatment at 910° C. for 20 hours and used for measurement of the critical current density Jc. Heating and cooling in this heat treatment were carried out at a rate of 200° C./hr.

The measurement of the Jc was made by a four-terminal method in liquid nitrogen. The Jc value was calculated by dividing a current determined at a distance between the terminals of 10 mm and a terminal voltage of 1 μV by the cross-sectional surface area of the oxide layer in each sample. The cross-sectional surface area was determined by a microscopic observation.

Relationships between the diameter, reduction in cross-sectional surface area, density of oxide layer and theoretical density ratio and Jc of the wires prepared by method [I] are shown in Table 3.

TABLE 3

| Diam. (mm) | Reduction in area (%) | Density of oxide layer (g/cm$^3$) | Thoretical density ratio | Jc (A/cm$^2$) |
|---|---|---|---|---|
| 1.7 | 92 | 4.8 | 0.76 | 230 |
| 1.2 | 96 | 5.0 | 0.79 | 300 |
| 0.7 | 99 | 4.9 | 0.78 | 280 |

As is seen from Table 3, the wires drawn by method [I] had as low a density as at most 5.0 g/cm$^3$ and a Jc value of at most 300 A/cm$^2$, even if the reduction in cross-sectional surface area was increased and the diameter reduced by drawing.

Figure 4:
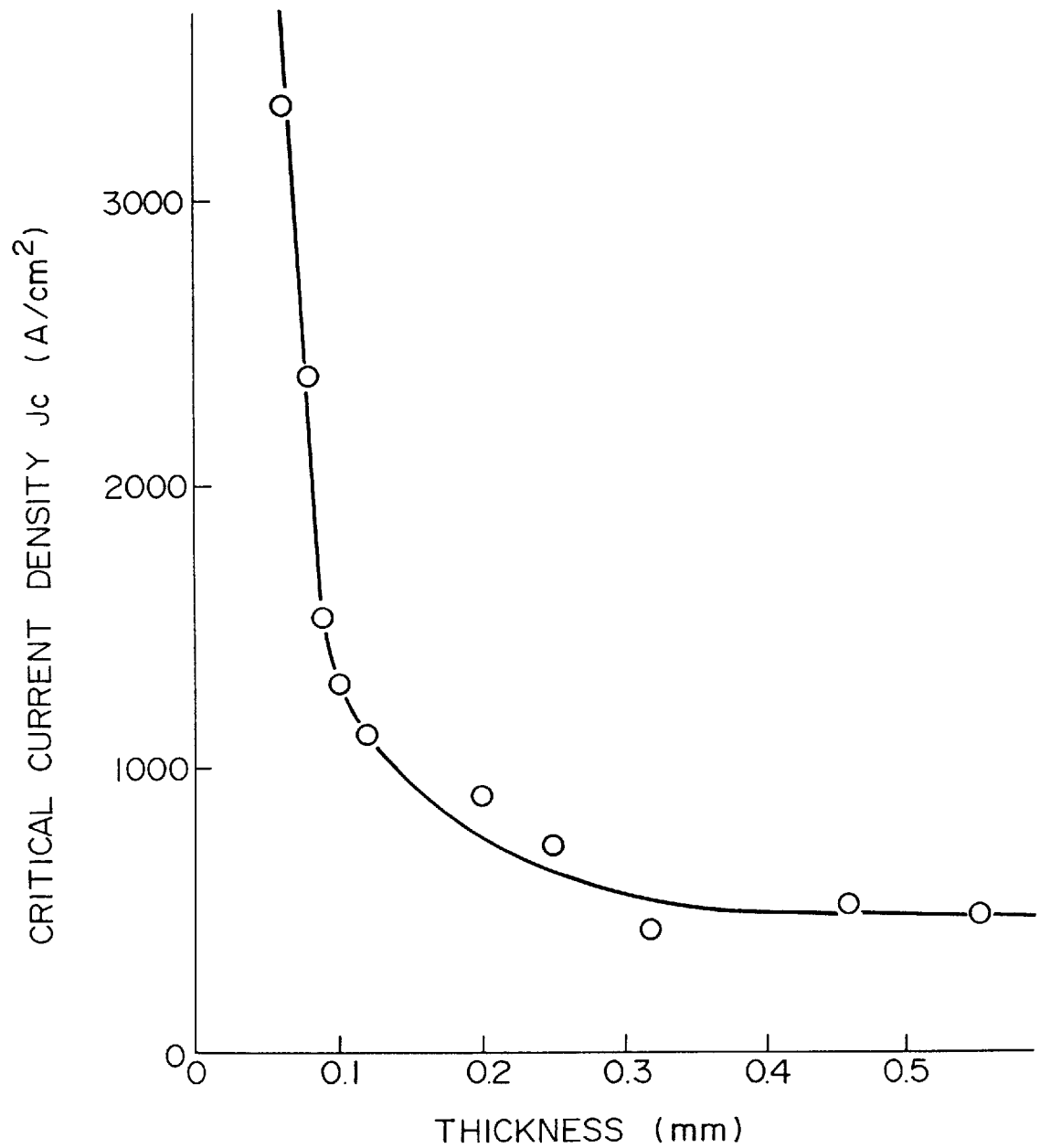
FIG. 4 is a graph showing a relationship between the thickness and critical current density Jc of the flat wire shown in FIG. 3.

FIG. 4 shows a relationship between the thickness and Jc of the wires prepared by method [II]. As is seen from FIG. 4, the Jc values are rapidly increased as the thickness is getting smaller below 0.2 mm. When the thickness was 0.06 mm, the Jc value was 3,330 A/cm$^2$, which was improved to be 10 times or more greater than that of the wire obtained only by drawing. The density of the oxide layer in the wires cold rolled to a thickness of not more than 0.2 mm was 5.7 g/cm$^3$ in all the cases, and the theoretical density ratio was 90% or more. The reduction in thickness was 93% when the thickness was 0.2 mm.

The relationship between the whole thickness of the wire prepared by method [II] and the thickness of the metal sheath of the wire shows that the wires having a thickness of not more than 0.2 mm and a high critical current density Jc had a total metal sheath thickness/whole wire thickness ratio of 35 to 75%.

When the whole thickness of wire was about 0.2 mm, the thickness of the sheath was about 46 μm and the thickness of the oxide layer was 110 μm. When the whole thickness of the wire was 0.1 mm, the thickness of the sheath was about 23 μm and the thickness of the oxide layer was about 56 μm. The Jc value of this wire was about 1,240 A/cm$^2$. Particularly, when the whole thickness of the wire was 0.06 mm, the thickness of the metal sheath was about 14 μm and the thickness of the oxide layer was about 34 μm. The Jc value of this wire was about 3,300 A/cm$^2$.

EXAMPLE 3

The same pellets of YBaCuO were prepared in the same manner as in Example 2. These pellets were pulverized by a grinder for 15 minutes. The observation of the cross section of the pulverized particles with a polarizing microscope (magnification: 200) revealed that a portion appearing to be particles in the microphotograph was a coarse particle fraction of about 70 μm in size.

The thus obtained YBaCuO powder as starting material was tapped into a pure silver-made tube of 6 mm in diameter and 0.5 mm in thickness. The packing density was 2.7 g/cm$^3$. This tube was drawn by a drawbench to a diameter of 2.8 mm. The density of the YBaCuO in the drawn tube was 4.3 g/cm$^3$. Then, the drawn tubes were cold rolled with various reductions by a 4 high cold strip mill to provide wires.

These wires were cut in a length of about 30 mm and subjected to the heat treatment at 910° C. for 20 hours to obtain samples for measurement of a critical current density Jc. Heating and cooling rates were 200° C./hr. The measurement of the Jc was made in liquid nitrogen by a four-terminal method. The Jc value was calculated by dividing a current determined at a distance between the terminals of 10 mm and a terminal voltage of 1 μV by the cross-sectional surface area of the oxide layer in each sample. The cross-sectional surface area was determined by a microscopic observation.

Figure 5:
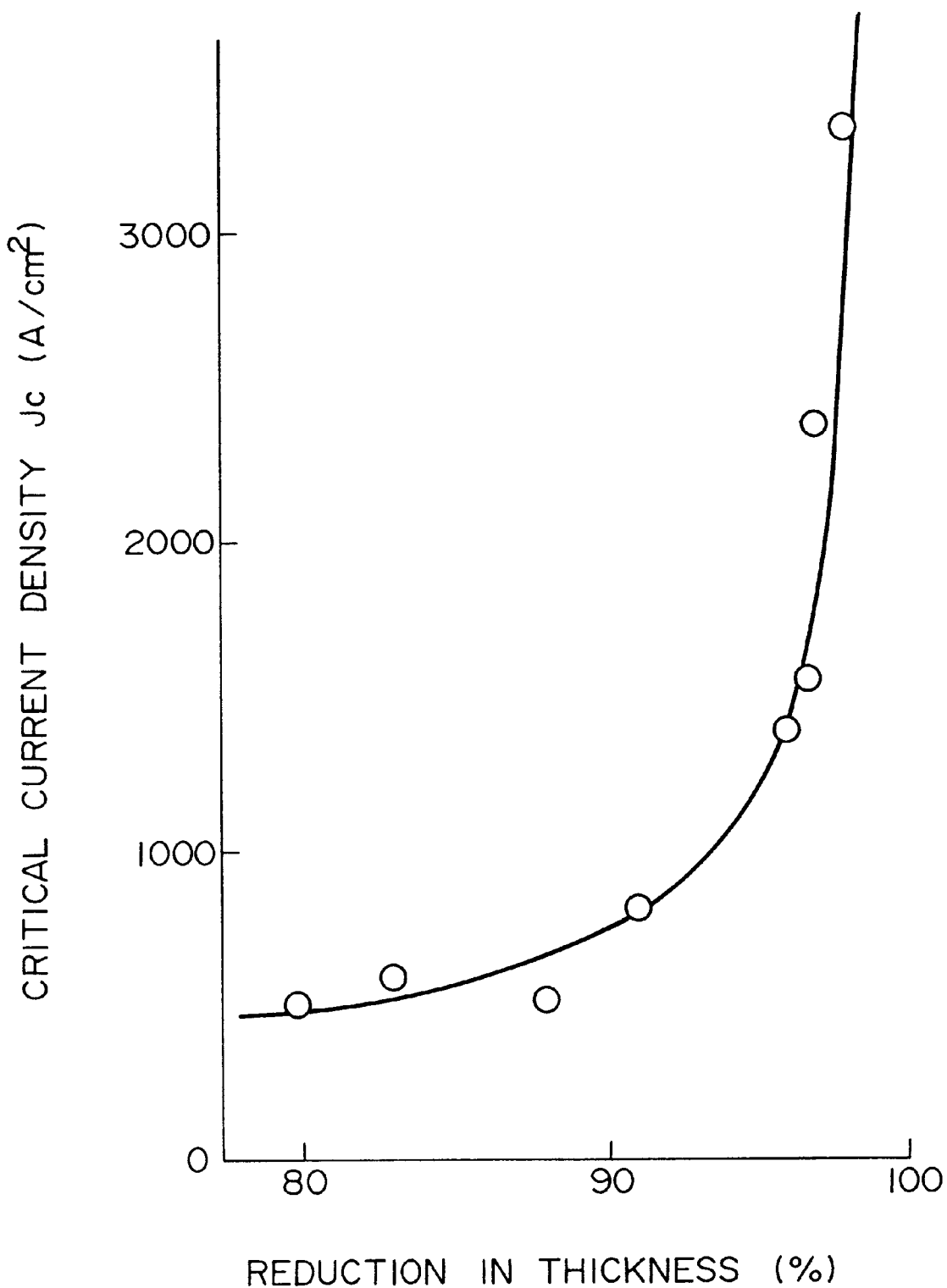
FIG. 5 is a graph showing a relationship between the reduction in thickness and critical current density Jc of the flat wire.

FIG. 5 is a graph showing a relationship between the reduction in thickness and critical current density of the wire. As is seen from FIG. 5, the Jc is rapidly increased when the reduction in thickness exceeds 90%, and the Jc was 1,000 A/cm$^2$ or more at a reduction in thickness exceeding 95%. Furthermore, the Jc was 3,300 A/cm$^2$ at a reduction in thickness exceeding 98%. The density of oxide layer in wire was 5.7 g/cm$^3$ when a reduction in thickness exceeded 90%.

The observation of the cross sections of wires worked at a reduction in thickness of 83% and at a reduction in thickness of 96% by a polarizing microscope (magnification: 200) revealed that the wire worked at a reduction in thickness of 83% left coarse particles of about 30 μm in size therein, whereas the wire worked at a reduction in thickness of 96% contained no such coarse particles but relatively uniformly sized particles therein.

The whole thickness of the flat wire worked at a reduction in thickness of 96% was 110 μm, the thickness of the metal sheath was about 20 to 25 μm and the thickness of the superconducting oxide layer about 60 to 70 μm.

What is claimed is:

1. A method of producing an oxide-type superconducting flat wire having a critical current density of at least 1,000 A/cm$^2$, comprising an oxide layer having a superconducting property and a metal layer surrounding the oxide layer and has so flat a cross section vertical to the longitudinal direction of the wire that the upper and lower lines between the oxide layer and the metal layers appearing on the cross section having a zone over which they are parallel to each other, the thickness of the oxide layer being cold rolled in the range of about 0.40 to 0.75 based on the whole thickness of the wire, said whole thickness being about 0.2 mm or less, and said metal layer being deformable to follow the shrink deformation of the oxide layer when heat treated to be sintered, but rigid when used, which comprises filling a metal tube with an oxide powder having a superconducting property, drawing the tube into a rod wire having a round cross section, then cold rolling the rod wire into the flat wire so that $(t_i-t)/t_i \times 100$ is equal to or more than about 90%, wherein $t_i$ is the whole thickness of the cross section of the rod wire before the cold rolling and t is the whole thickness of the cold-rolled flat wire, and then heat treating the flat wire to sinter the superconducting oxide.

2. The method according to claim 1, wherein the oxide layer comprises a Y—Ba—Cu oxide.

3. The method according to claim 1, wherein the metal layer was made of pure silver or silver base alloy of which the alloying element is one or more selected from palladium, platinum, ruthenium and gold.

4. The method according to claim 3, wherein the alloying element is contained in an amount of about 10% by weight or less in the alloy.

5. The method according to claim 1, wherein the heat treatment is carried out in an oxygen-containing atmosphere at a temperature of about 870 to 950° C.

6. A method of producing an oxide-type superconducting flat wire having a critical current density of at least 1,000 A/cm$^2$, comprising an oxide layer having a superconducting property and a metal layer surrounding the oxide layer and having so flat a cross section vertical to the longitudinal direction of the wire that the upper and lower lines between the oxide layer and the metal layers appearing on the cross section have a zone over which they are parallel to each other, the thickness of the oxide layer being cold rolled in the range of about 0.35 to 0.65 based on the whole thickness of the wire, said whole thickness being about 0.2 mm or less, and said metal layer being deformable to follow the shrink deformation of the oxide layer when heat treated to be sintered, but rigid when used, which comprises filling a metal tube with an oxide powder having a superconducting property, drawing the tube into a rod wire having a round cross section, so that said drawing achieves a reduction in cross-sectional area of at least 60%, then cold rolling the rod wire into the flat wire so that the density of the cold rolled wire is about 90% or more of the theoretical density thereof and $(t_i-t)/t_i \times 100$ is equal to or more than about 90%, wherein ti is the whole thickness of the cross section of the rod wire before the cold rolling and t is the whole thickness of the cold-rolled flat wire, and then heat treating the flat wire to sinter the superconducting oxide.

* * * * *